US006128324A

United States Patent [19]
Shah et al.

[11] Patent Number: 6,128,324
[45] Date of Patent: Oct. 3, 2000

[54] HIGH SPEED, SPATIALLY SWITCHING LIGHT

[75] Inventors: Pankaj B. Shah, Silver Spring, Md.; Walter R. Buchwald, Hampstead, N.H.; Vladimir V. Mitin, Farmington Hills, Mich.

[73] Assignee: The United States of America as represented by the Secretary of the Army, Washington, D.C.

[21] Appl. No.: 09/031,026

[22] Filed: Feb. 26, 1998

[51] Int. Cl.[7] .................................................. H01S 3/103
[52] U.S. Cl. .............................. 372/50; 257/134; 372/46
[58] Field of Search ................................ 257/184, 187, 257/918, 107, 163, 164; 372/8, 43, 175, 7, 46, 50

[56] References Cited

U.S. PATENT DOCUMENTS

| | | | |
|---|---|---|---|
| 5,065,044 | 11/1991 | Kasahara et al. | 307/324 |
| 5,572,540 | 11/1996 | Cheng | 372/50 |
| 5,677,552 | 10/1997 | Ogura | 257/113 |

OTHER PUBLICATIONS

R. Pereika et al., "Optoelectronic Switch with Low Holding Power," 26 Electronic Letters No. 5, pp. 280–282, Mar. 1990.
Paul R. Claisse et al., "Electrical and Optical Swtiching Characteristics of the Single–Quantum–Well DOES Laser", IEEE Transactions On Electron Devices, vol. 39, No. 11, pp. 2523–2527, Nov. 92.
Walter R. Buchwald et al., "A Three Terminal InP/InGaAsP Optoelectronic Thyristor", IEEE Transactions On Electron Devices, vol. 41, No. 4, pp. 620–622, Apr. 1994.
Y. Sun et al., "Beam Steerable semiconductor lasers with large steering range and resolvable spots", Electronics Letters, vol. 30, No. 24, pp. 2034&2035, Nov. 1994.
Y. Sun et al., "Thermally Controlled Lateral Beam Shift and Beam Steering in Semiconductor Lasers",IEEE Photonics Technology Letters, vol. 7, No. 1, pp. 26–28, Jan. 1995.
L. Fan et al., "Dynamic Beam Switching of Vertical–Cavity Surface–Emitting Lasers with Integrated Optical Beam Routers", IEEE Technology Letters, vol. 9, No. 4, pp. 505–507, Apr. 1997.
S.M. Jackson et al., "Optical Beamsteering Using Integrated Optical Modulators", Journal of Lightwave Technology, vol. 15, No. 12, pp. 2259–2262, Dec. 1997.

(List continued on next page.)

Primary Examiner—James W. Davie
Attorney, Agent, or Firm—Michael Zelenka; George B. Tereschuk

[57] ABSTRACT

A high speed, compact and reliable semiconductor device for spatially switching light in optical switching networks, optical computers and optical interconnection networks is provided. The semiconductor device for spatially switching light comprises stacked P-anode, inner n-base, inner p-base and cathode layers, with an anode cathode on the P-anode layer defining a ridge. A low reverse bias is provided by a biasing means connected to a gate electrode disposed on a ledge of one base layer. A light emission region on the gate electrode side emits light, and a current flow induces a transversely flowing, narrow, light emitting channel that can be spatially shifted by switching the single gate electrode's bias. A high reverse bias also provides a spatially shifted light emission region in another part of the device's face. A cathode electrode is disposed on a portion of the bottom surface of the N-cathode layer, below the gate electrode and most of the cathode region below the ridge is not covered by the cathode electrode. Other embodiments include related variations, a semiconductor device for spatially switching light in a laser and a semiconductor device for spatially switching light in a selective amplifier for optical switching networks, optical computers, optical interconnection systems and related uses. The location of the cathode electrode is important because it induces the horizontal current flow in the cathode region, that is required for the existence of the transversely flowing, narrow, light emitting channel.

61 Claims, 9 Drawing Sheets

OTHER PUBLICATIONS

A.V. Chelnokov et al., "Ultrashort Pulses in Diffraction–Limited Beam From Diode Laser Arrays With External Cavity", Electronics Letters, vol. 29, No. 10, pp. 881&882, May 1993.

Sophie Bouchoule et al., "Highly Attenuating External Cavity for Picosecond–Tunable Pulse Generation from Gain/Q–Switched Laser Diodes", IEEE Journal of Quantum Electronics, vol. 29, No. 6, pp. 1693–1699, Jun. 1993.

W.K. Burns et al., "Active branching waveguide modulators", Applied Physics Letters, vol. 23, No. 12, Dec. pp. 790–792, pp. 1976.

H. Sasaki et al., "Theoretical and Experimental Studies on Active Y–Junctions in Optical Waveguides", IEEE Journal of Quantum Electronics, vol. QE–14, No. 11, pp. 883–892, Nov. 1978.

P. Granestrand et al., "Integrated Optics 4x4 Switch Matrix With Digital Optical Switches", Electronics Letters, vol. 26, No. 1, pp. 4&5, Jan. 1990.

HIGH SPEED, SPATIALLY SWITCHING LIGHT

GOVERNMENT INTEREST

The invention described herein may be manufactured, used and licensed by or for the Government of the United States of America without the payment to me of any royalties thereon.

BACKGROUND OF THE INVENTION

Field of the Invention

This invention relates to the field of solid state optoelectronic devices, optoelectronic integrated circuits, thyristor based light emitters, and spatially switching light emitters or amplifiers. More particularly, the present invention relates to compact devices for high speed spatial switching, or beam steering, of internally generated or amplification and high speed spatial switching of externally injected light.

Recent history has demonstrated that simple but more capable and functional optoelectronic devices are leading the way to advances in the fields of communications, pharmaceutical, transportation, and environmental applications. Thus, there is a long-felt need for simplifying semiconductor production.

The present inventors have addressed the long-felt needs for simplifying semiconductor device production in the field of optical switching networks by providing a device with a semiconductor structure for spatially switching light in optical switching networks with the bottom electrode designed for horizontal current flow as current enters the bottom region and dopants for free carrier concentrations in base and emitter layers sufficiently close in value to allow gate control of the location of a light emitting channel to occur. The present invention provides a simplified, compact, reliable and high speed semiconductor device for spatial switching of light emitter in optical switching networks in which only one component functions as both a light emitter and a spatial switcher, with switching accomplished by changing the bias of just a single electrode. By using fewer parts, the simplified spatial switching light emitter of the present invention provides longer semiconductor device lifetimes while still advantageously using increased semiconductor capability and reduced production cost. Due to this simplified structure, this invention's spatially switching light semiconductor thyristor based structures provide significant cost and operational advantages, without suffering from the drawbacks, limitations and shortcomings of increased production cost in prior art devices.

The prior art optoelectronic devices fall into four categories, light emitting thyristors, beam steering light emitters, spatially switching amplifiers and external cavity lasers.

Prior art thyristor structures include the silicon-controlled rectifier (SCR's), the gate turn off (GTO) thyristor and the MOS controlled thyristor (MCT), however, they do not have the capability of emitting light in two different locations at different times. They also employ a bottom electrode covering the entire lower surface, while the present invention's structure only covers a portion of that surface. Additionally, none of the prior art thyristor structures allow moving the light emission region using a single electrode as the present invention does. Further, most prior art thyristor structures have an operational speed based on fixing the gate's current, while the thyristor structures of this invention change potential bias at the voltage, rather than the current, of the gate.

Prior art does include a spatially switching thyristor that requires changing the bias at two electrodes in a correlated manner to reduce the light emission in one location and increase it in another. See for example, V. Korobov et al., vol. 1 of Proceedings of the Optical Engineering Midwest Conference, page 374, 1995. Since only one electrode is used in switching in the devices of the present invention, the number of external contacts are reduced, the parasitic effects of the additional electrode and the external contacts are eliminated, making the design and packaging of this structure more compact than other structures. In accordance with the present invention, using fewer parts should reduce manufacturing, alignment and assembly costs.

Prior art beam steering light emitters include a number of complex structures that do not provide the advantages of simplified production costs. While multiple frequency emitting lasers also exist, they are also suffer from increased complexity and higher production costs.

Having one device function as a beam steering light emitter allows manufacturers to reduce costs by avoiding time-consuming and costly retooling operations to switch from processing one device to another. Also, because the steering or switching function in these devices comes about by changing the bias at only one gate electrode, the process of designing the circuit in which these devices will operate is simplified and fewer components will be needed there as well. Also, the production steps during manufacturing are compatible with current layer deposition equipment available at most fabrication plants.

Moreover, the devices of the present invention also provide other hitherto unavailable advantages. These advantages include larger spatial separation of emitted light for the same overall device size when compared to waveguide based spatial switches because spatial switching is due to moving the light emission region rather than bending the light beam, good gain is provided because the control circuit which changes the voltage on the gate electrode is required to operate at roughly one-tenth the light emission channel current. Other advantages are ease of integration with other semiconductor devices, single electrode control, a faster turn-off that depends on drift diffusion for carrier removal rather than recombination and faster laser switching on and off. Another additional advantage is the capability to use different external cavities surrounding a single active region of a semiconductor laser, so that by changing only a single bias, the operator can modulate either the emitted light's wavelength or the repetition rate in a pulsed laser. The laser embodiment also permits turning lasing on and off by moving the light emitting electron-hole plasma in and out of the regenerative feedback cavity where high gain occurs. The present invention also provides added advantages of selectively amplifying optical signals and the simplified structure of all embodiments makes them easier to fabricate and grow than prior art devices. Due to this invention's simplified structure, these and other advantages are provided without suffering from the drawbacks, limitations and shortcomings of more complex and expensive prior art semiconductor devices.

Additionally, since current spatial switching speeds are limited to the nanosecond range by carrier dynamics, which includes their lifetime, the present invention's use of drift and diffusion for carrier removal from the light emission region during switching, eliminates this problem. Therefore, the devices of the present invention will allow for fast switching of light through different paths in an optical switching network. Furthermore, the devices of the present invention are polarization insensitive to amplify, and spatially switch, injected light.

Potential applications and uses of the devices of the present invention include optical signal processors, optical computers, optical interconnection networks, optical switching networks, high-rate data routers, and lightweight agile beam-steering units. Further, the three terminal devices of the present invention can take three electrical signals and emit spatially switching light, allowing for the design of systems where this device would be a logical bridge between an optimized electronic system and either one of two optimized optical system.

Prior art light emitting thyristors devices and structures are described in the following publications:

R. Pereika et al., "Optoelectronic Switch with Low Holding Power," 26 Electronic Letters No. 5, pp. 280–2, Mar. 1990;

Claisse et al., "Electrical and Optical Switching Characteristics of the Single-Quantum-Well DOES Laser," 39 IEEE Transactions On Electron Devices No. 11, pp. 2523–7, Nov. 1992; and Buchwald et al., "A Three Terminal InP/InGaAsP Optoelectronic Thyristor," 41 IEEE Transactions On Electron devices No. 4, pp. 620–2, Apr. 1994.

Prior art light emitting beam steering light emitters devices and structures are described in the following publications:

Y. Sun et al., "Beam Steerable Semiconductor Laser with Large Steering Range and Resolvable Spots," 30 Electronics Letters No. 24, pages 2034–35, Nov. 1994;

Y. Sun, et al., "Thermally Controlled Lateral Beam Shift and Beam Steering in Semiconductor Lasers," 7 IEEE Photonics Technology Letters, No. 1, pp, 26–28, Jan. 1995;

L. Fan et al., "Dynamic Beam Switching of Vertical-Cavity Surface-Emitting Lasers with Integrated Optical Beam Routers," 9 IEEE Photonics Technology Letters, No. 4, pp. 505–7, Apr. 1995; and S. M. Jackson et al., "Optical Beamsteering Using Integrated Optical Modulators," 15 Journal of Lightwave Technology No. 12, pp. 2259–62, Dec. 1997.

Prior art external cavity laser devices and structures are described in the following publications:

A. V. Chelnokov et al., "Ultrashort Pulses in Diffraction-Limited Beam From Diode Laser Arrays With External Cavity," 29 Electronics Letters No. 10, pp. 881–2, May 1993; and S. Bouchoule et al., "Highly Attenuating External cavity for Picosecond-Tunable Pulse Generation from Gain/Q-Switched Laser Diodes," 29 IEEE Journal of Quantum Electronics No. 6, pp. 1693–9, June 1993.

Prior art spatially switching amplifiers devices and structures are described in the following publications:

W. K. Burns et al., "Active Branching Waveguide Modulator," 23 Applied Physics Letters No. 12, pp. 790–2, Dec. 1976;

H. Sasaki et al., "Theoretical and Experimental Studies on Active Y-Junctions in Optical Waveguides," vol. QE-14 IEEE Journal of Quantum Electronics No. 11, pp. 883–92, Nov. 1978; and P. Granestrand et al., "Integrated Optics 4×4 Switch matrix With digital Optical Switches," 26 Electronics letters No. 1, pp. 4–5, Jan. 1990.

SUMMARY OF THE INVENTION

Accordingly, it is an object of the present invention to provide a high speed semiconductor device for spatially switching light, employing current flow to induce a transversely flowing, narrow, light emitting channel that can be spatially shifted by switching a single electrode's bias.

Another object is furnishing a semiconductor device for spatially switching light, acting as a light emitter employing current flow to induce a transversely flowing, narrow, light emitting channel, providing optical switching networks with fast switching of light through different paths and use of different external cavities surrounding a single active region of a semiconductor laser.

A further additional object is providing a semiconductor for spatially switching light in lasers employing current flow inducing a transversely flowing, narrow, light emitting channel, where lasing is turned on and off by moving the light emitting electron-hole plasma into and out of the regenerative feedback cavity where high gain occurs.

It is an additional object of the present invention to provide a compact and reliable high speed, semiconductor spatially switching amplifier, employing current flow to induce a transversely flowing, narrow, light emitting channel that can be spatially shifted by switching a single electrode's bias.

These and other objects and advantages are provided by the semiconductor spatially switching thyristor based devices of the present invention for optical switching networks and related uses comprising stacked anode, base and cathode layers, with an anode layer defining a ridge. A low reverse bias is provided by a biasing means connected to a gate electrode disposed on one base layer. A light emission region on the gate electrode side emits light, and a current flow induces a transversely flowing, narrow, light emitting channel that can be spatially shifted by switching the single gate electrode's bias. In accordance with the simplified structure of the devices of the present invention, these and other advantages are provided without suffering from the drawbacks, limitations and shortcomings of more complex and expensive prior art semiconductor devices. The present invention also contemplates embodiments employing a high reverse bias gate, a laser, a selective amplifier and related variations.

BRIEF DESCRIPTION OF THE DRAWINGS

The advantages, features and details of the present invention can be better appreciated by referring to the following drawings.

DETAILED DESCRIPTION OF THE DRAWINGS

All embodiments of the present invention operate within an optical switching network, which transfers information from one input to one of several outputs depending on the current state of the spatial switches that link the optical path from the input to the desired output. A good optical switching network will maintain quality of information by not reducing the bandwidth or attenuating the signal. The present invention provides this capability and the state is determined by the bias applied at the gate electrode. Other related uses include optical computers and optical interconnection networks.

Figure 1:
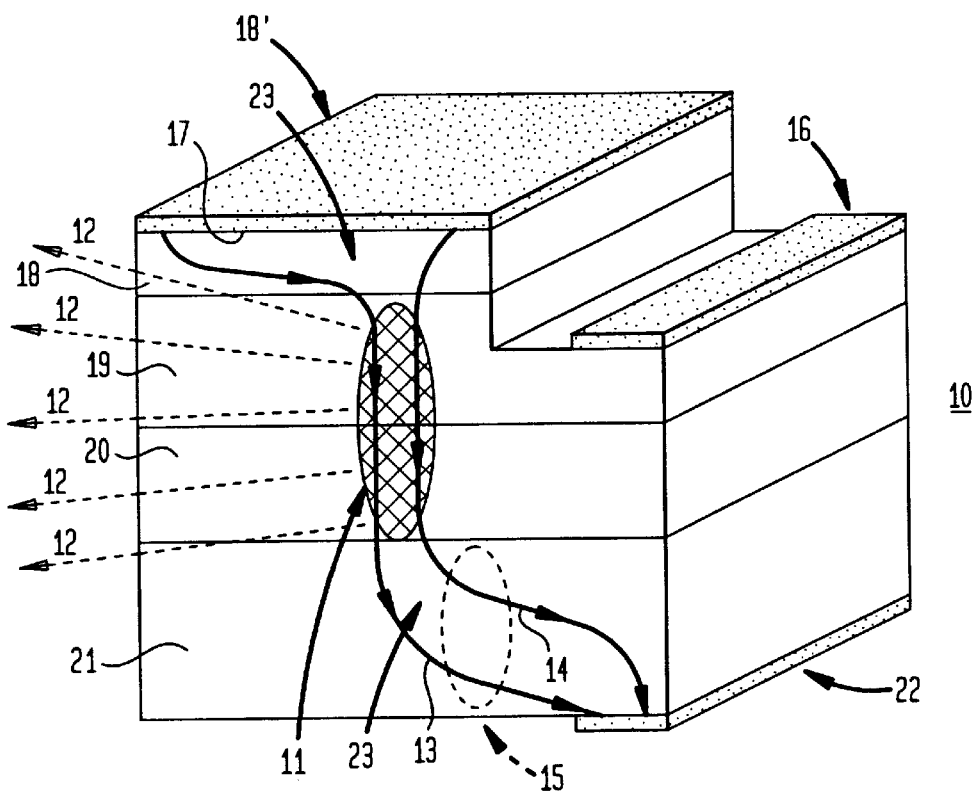
FIG. 1 is a conceptual, cross-sectional perspective drawing illustrating the operation of the present invention with a low reverse bias on the gate electrode.

Referring now to the drawings, FIG. 1 is a conceptual; cross-sectional perspective drawing of the semiconductor device for spatially switching light of the present invention operating with a low reverse bias. The light emitter 10 comprises a horizontally (in the x direction) flowing current through the cathode layer which then flows through a plurality of anode, base and cathode layers where it induces a transversely flowing, light emitting channel that can be spatially shifted by switching a single electrode's bias within the light emitter. The present invention advantageously employs a bottom cathode electrode designed for horizontal current flow as current enters the bottom region and also uses dopants for free carrier concentrations in base and emitter layers sufficiently close in value to allow gate control of a light emitting channel to occur. The crosshatched elliptical region represents a light emission region 11, which emits light, indicated by arrows 12. A current path 15, identified by arrows 13 and 14, respectively, flows to a cathode electrode 22. An outer P-anode layer 18 is disposed on top of an inner n-base layer 19. An anode electrode 18' is positioned on top of said outer P-anode layer 18, said outer P-anode layer 18 and anode electrode 18' defining a ridge 17, and the outer P-anode layer 18 having an anode width, W. Said outer P-anode layer could also function as an anode electrode. Said inner n-base 19 having an upper portion and a lower portion, said lower portion of the inner n-base layer 19 extending outward along a horizontal axis, said inner n-base layer 19 having a horizontal width that is wider than said upper portion to define a ledge on one side of said inner n-base layer 19. Said inner n-base layer 19 being stacked on top of a p-base layer 20, which is stacked on an outer N-cathode bottom layer 21. A gate electrode 16 is disposed on said ledge, and is connected to a means for biasing.

Said light emission region 11 and the light emission 12 is in proximity to said electrode gate 16. Said outer P-anode layer 18 and said outer N-cathode bottom layer 21 are more highly doped than said inner p-base layer 20 and said inner n-base layer 19. The resistance of said outer P-anode layer 18 should be slightly lower than the resistance of said inner n-base layer 19, while the resistance of said outer N-cathode bottom layer 21 should be slightly lower than the resistance of said inner p-base layer 20. Said gate electrode 16 can cover either the entire ledge, or only portion of it in the horizontal direction. More significantly, said cathode electrode 22, having a width, W', which is less than said anode width, W, covers a portion of the bottom surface of said outer N-cathode bottom layer 21, and not said outer N-cathode 21's entire bottom surface.

Figure 3:
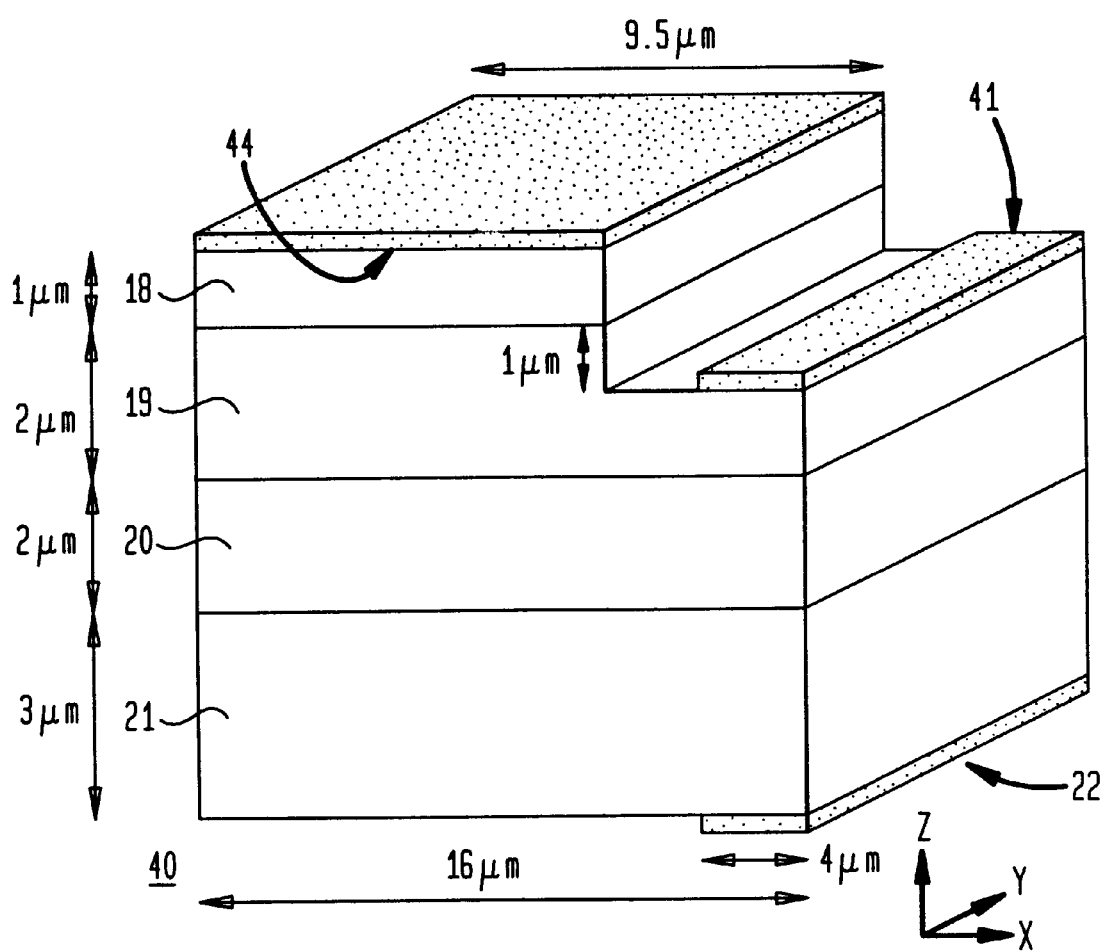
FIG. 3 is a cross-sectional perspective drawing depicting dimensions and structure in the preferred embodiment of the high speed, semiconductor for spatially switching light of the present invention.

The amount of coverage of said cathode electrode 22 over a portion of the bottom surface of said outer N-cathode bottom layer 21, with said cathode width, W', being less than said anode width, W, is significant in terms of the amount of current flow 15. Moreover, the partial coverage of said cathode electrode 22, being narrower than said anode width, W, over only a portion of the bottom surface of said outer N-cathode bottom layer 21, induces the lateral current flow 15 moving horizontally through a larger portion of said outer N-cathode bottom layer 21. The partial coverage of said cathode electrode 22 over said bottom surface of the outer N-cathode bottom layer 21 thereby exposes that portion of the bottom surface lying directly below said ridge 17. It has been observed that when said cathode electrode 22 completely covers the outer N-cathode bottom layer 21 the required horizontal current flow would not take place. FIG. 3 illustrates preferred dimensions for the entire structure, and the preferred anode width W is 9.5 $\mu$m, although said anode width can vary according to the designer's requirements, including widening the ridge 17 to vary the degree of spatially switching of said light emission region 11. The FIG. 3 preferred cathode electrode width, W', of said cathode electrode 22 is 4 $\mu$m, said cathode electrode width, W', can also be varied according to the designer's requirements. The layers are composed of a direct band gap semiconductor material, such as GaAs, and can include binary, ternary or quaternary semiconductor compounds such as AlGaN, GaN, SiC, ZnSe, InGaAsP or subsets of these systems.

The crosshatched elliptical region 11 is the light emission area on the gate electrode side of the structure 10 when said biasing means connected to said gate electrode 16 provides a low reverse bias. Said anode electrode 18', said gate electrode 16 and said cathode electrode 22 all have an ohmic contact surface, formed by the proper metallization process.

In operation, the positioning and size of said cathode electrode 22 causes said electrical current 15 to have a strong lateral flow in said outer N-cathode bottom layer 21. A semiconductor device with this type of lateral current flow will first turn ON in a narrow vertical PnpN region 23 either at the left edge or the right edge of the gate electrode side. The current through said cathode electrode 22 should be close to, but just below, the holding current of this thyristor for proper operation. When the device's current 15 flowing through said cathode electrode 22 is allowed to increase, the ON region will spread out to cover the entire lateral width of the ridge 17. However, if the current through said cathode electrode 22 is fixed just below the holding current of the light emitter 10, then only said narrow PnpN channel 23 through the PnpN regions 18–20, respectively, is maintained ON. The present invention's thyristor based semiconductor light emitter structure keeps current within the narrow PnpN channel 23 because the cathode electrode 22 having said cathode width, W', does not cover the entire bottom surface of the outer N-cathode bottom layer 21 like the typical prior art device. The holding current is defined as the current through the cathode electrode 22 when its derivative with respect to the anode-cathode voltage is infinite and the anode-cathode voltage is very close to its value in the device's ON state, according to the following formula:

$$\left.\frac{\partial I_C}{\partial V_{AK}}\right|_{I_C=I_H} = \infty$$

where $I_c$ is the cathode current, $I_H$ is the holding current, and $V_{AK}$ is the anode-cathode bias. In prior art structures where the anode and cathode electrodes cover the entire top and bottom surfaces, the device would be considered OFF if the anode current was below the device's measured holding current. However, in the present invention's thyristor based semiconductor spatially switching light emitter 10, the device is ON because said current 15 flows through said narrow PnpN channel 23. In accordance with the present invention, once a portion of light emitter 10 is ON, the narrow PnpN channel 23 of high current flow 15 begins to spread out to cover a larger width of the ridge 17. However, if the total injected current is fixed, the light emitter 10 begins to turn OFF as the ON region spreads. Eventually a steady state mode of operation is reached in which the current flows through said narrow PnpN channel 23.

The explanation for the light emission from said narrow PnpN channel 23 is that this narrow region is composed of a higher density of electrons and holes than the surrounding outer P-anode, inner n-base and inner p-base layers, 18–20, respectively. Therefore the light emission due to electron-hole recombination will be stronger in said narrow PnpN channel 23.

To increase the efficiency of light emission, a direct band gap semiconductor material should be used for said n-base layer 19 and said p-base layer 20 from which strong light emission is desired. These layers could also comprise quantum well structures or heterostructures to increase the recombination efficiency and obtain different wavelengths of light emission. When using quantum well structures for the layers, at least either said inner n-base layer 19 or said inner p-base layer 20, or both of them, should be composed of that material. When using heterostructure layers, said inner n-base layer 19 and said inner p-base layer 20 will each have a narrower band gap than said outer P-anode layer 18 and said outer n-cathode bottom layer 21. Other alternate layer arrangements include providing an abrupt junction between the layers and beveling the front surface of each layer along a vertical axis to increase breakdown voltage. The device could also be configured so that said anode electrode 18' and said cathode electrode 22 each provide a fixed voltage so that varying the low reverse bias switches said narrow PnpN channel 23. When said inner n-base layer 19 and said inner p-base layer 20 are composed of a direct band gap semiconductor material with a given energy gap, said outer P-anode layer 18 and said outer N-cathode bottom layer 21 can have a greater energy gap. A number of alternate embodiments of the semiconductor device for spatially switching light of the present invention involving slightly different outer P-cathode layer shapes and positioning of the cathode electrode 22 are depicted in FIGS. 8 (a)–(c), which will be described further below.

Figure 2:
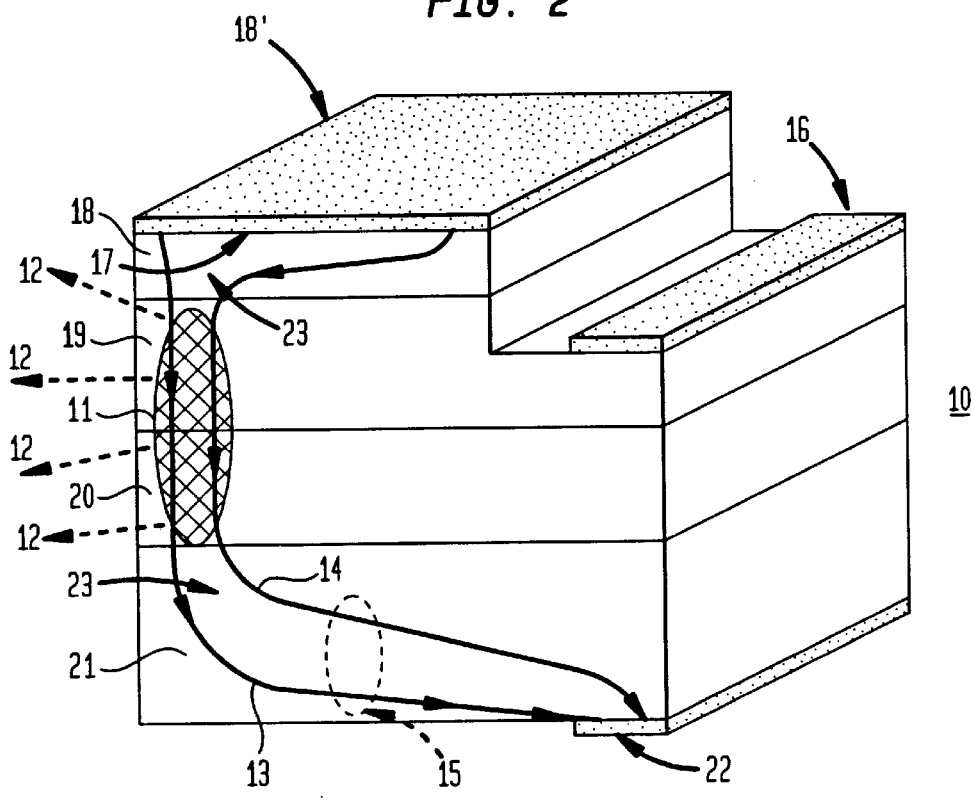
FIG. 2 is a conceptual, cross-sectional perspective drawing illustrating the operation of the present invention with a high reverse bias on the gate electrode.

Referring now to FIG. 2, the same spatially switching light emission semiconductor device 10 of the present invention is depicted, with like numerals from FIG. 1 referring to the same structural components in FIG. 2. Except that FIG. 2 shows operation with a high reverse bias from said biasing means of the gate electrode 16. By employing the high reverse bias, said light emission region 11 has moved opposite said ridge side and said gate electrode 16, rather than near the ridge side as depicted in FIG. 1. Spatial switching of the elliptical light emission region 11 is caused by setting said biasing means of the gate electrode 16's reverse bias so that either a narrow PnpN region 31 along the left edge, or possibly along the right edge, of said ridge 17 turns ON. The ridge 17 can be formed by an anode electrode 18' being disposed on said outer P-anode layer 18, or said outer P-anode layer 18 acting as an anode electrode, or by etching. Said ridge 17 can also be widened to provide increased spatial separation between the light emission region 12 created by either the low or high reverse bias at the gate electrode.

Figure 4:
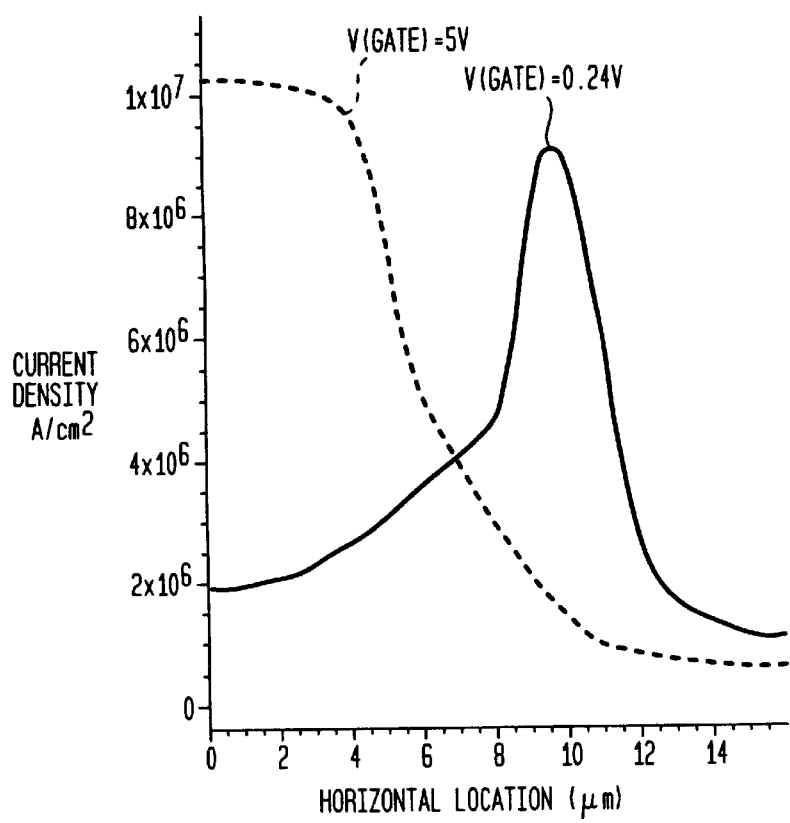
FIG. 4 is a graph depicting current flow when switching from one spatial location to another as the gate bias changes, with a Z directed current density of 3 μm in the semiconductor for spatially switching light of the present invention.
Figure 5:
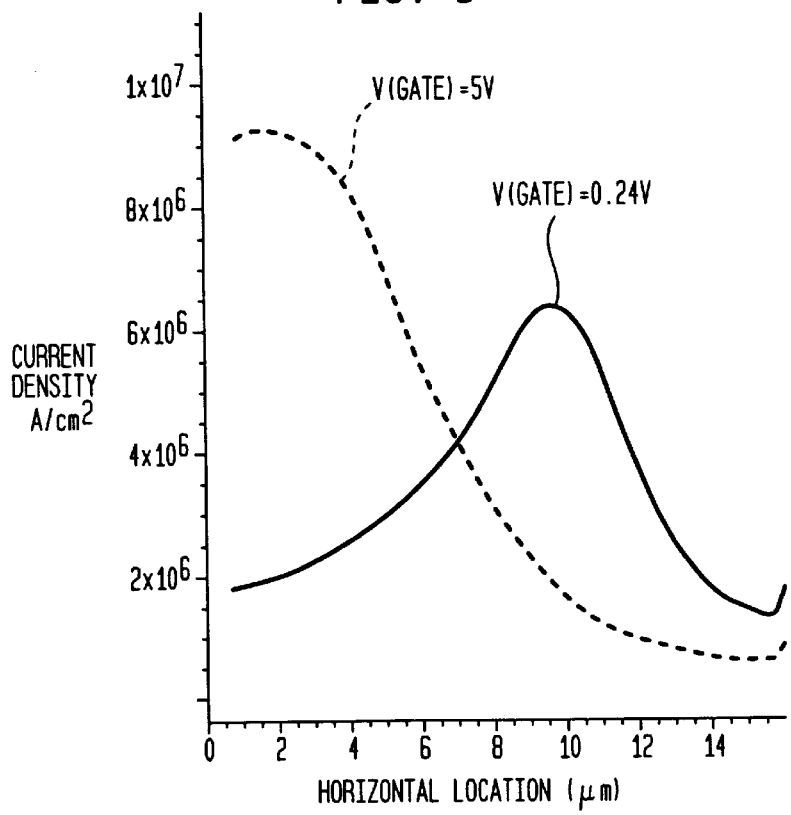
FIG. 5 is a graph depicting current flow when switching from one spatial location to another as the gate bias changes, with a Z directed current density of 4.5 μm below the topmost P-anode region's surface in the semiconductor for spatially switching light of the present invention.
Figure 6:
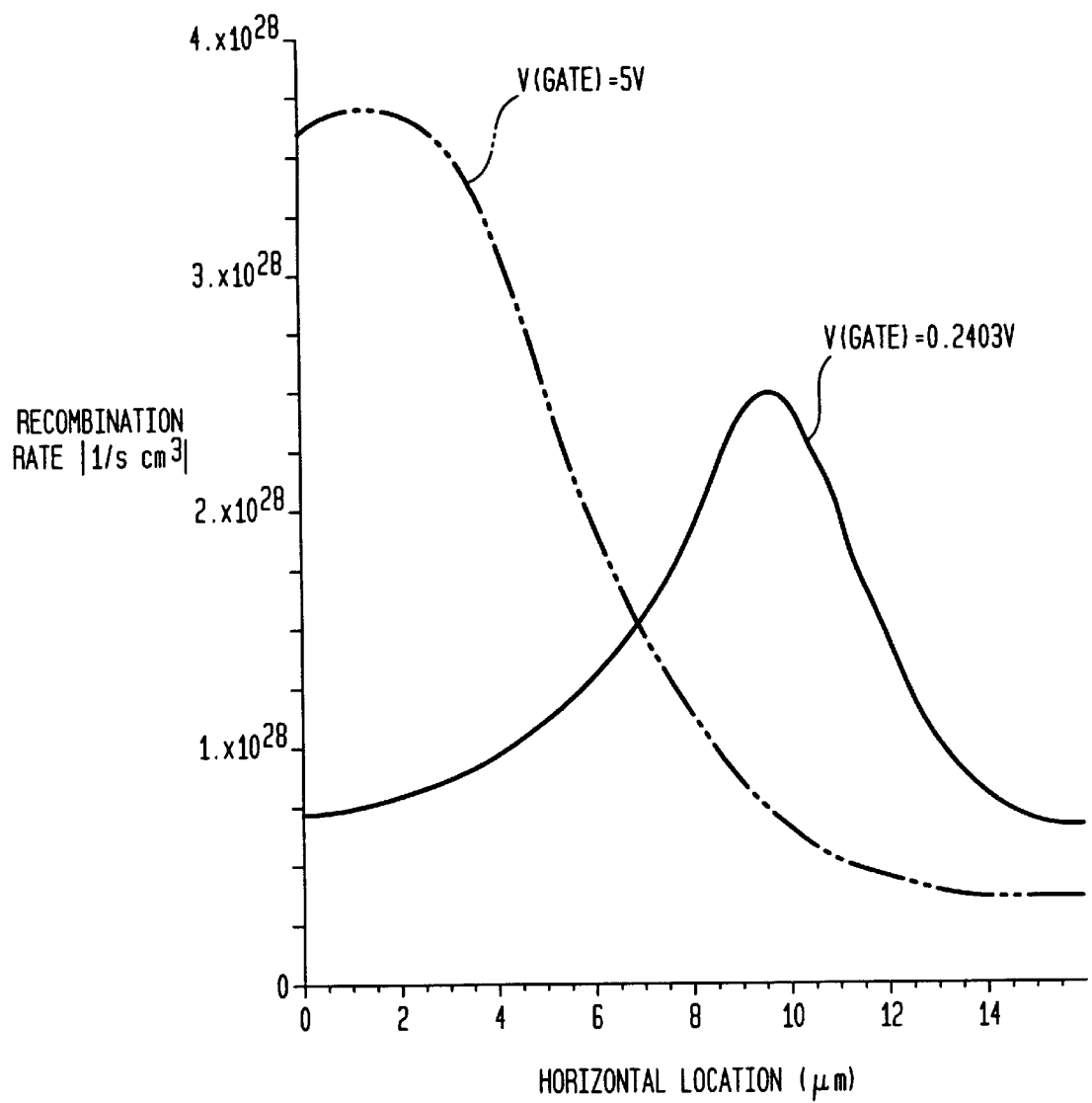
FIG. 6 is a graph depicting light emission being spatially switched from the region below the right edge of the ridge, to the left edge of the light emitter as the gate's reverse bias increases from 0.2403 V to 5.0 V.

Referring now to FIG. 3, the preferred embodiment of semiconductor device for spatially switching light 40 depicted was simulated to demonstrate the present invention's spatial switching capability, with the results presented in the FIG. 4, 5 and 6 graphs. FIG. 3 also provides additional details on preferred dimensions and the two current flow options for light emission on either the ridge side or the side opposite said ridge 44. For the sake of simplicity, like numerals for layers 18–21, respectively, and cathode electrode 22 are employed in this drawing. When a biasing means connected to a gate electrode 41 has a reverse bias set low such as 0.24V, the vertical PnpN region closest to the gate electrode 41 turns ON. When the biasing means' reverse bias is increased to 5V, the vertical PnpN region opposite said gate electrode 41 turns ON and the PnpN region near the gate electrode will turn OFF. The region of light emission follows the region of high current flow, and thus the light emission is spatially switched by changing the gate bias. The entire anode width of ridge 44 is never ON with such a low device current; because a fixed amount of device current being injected would spread over the entire anode width. Then, the current flowing through either said narrow PnpN region would fall below the ON state current and the entire structure 40 would turn OFF as described in FIG. 7. Besides the bias at the gate electrode 41 determining which edge turns ON first, the dopant concentration of the bases relative to the anode and cathode regions are also important in determining the behavior of structure 40.

In this preferred embodiment, the layers, or epi-layers, were composed of GaAs, deposited by the bottom layer first with, or using, molecular beam epitaxy, or any other similar method. During the deposition of each layer, the dopant material was added to the deposition mixture to make the layer being deposited either n-type or p-type. Thus the junctions have abrupt doping to form abrupt junctions between the layers. The dopants are composed of materials that are fully ionized at the operating temperature of the invention. The n-type layers use silicon dopant atoms, while the p-type layers use beryllium dopant atoms.

For the simulation results shown in the FIGS. 4–6 charts, the material parameters were employing GaAs material were: optical recombination rate coefficient: $2.394 \times 10^{-10}$ cm$^3$/s; effective density of states for electrons: $4.3597 \times 10^{17}$ cm$^{-3}$; effective density of states for holes: $7.5887 \times 10^{18}$ cm$^{-3}$; electron mobility of 8500 cm$^2$/V/s; and hole mobility: 400 cm$^2$/V/s, along with typical GaAs parameters for the models of field dependent mobility, SRH recombination, direct band to band recombination, and fermi statistics for carrier distribution.

The following dopant concentrations were used in connection with the FIG. 3 thyristor: $N_A=5\times10^{19}$ cm$^{-3}$ for the anode 44; $N_D=5\times10^{18}$ cm$^{-3}$ for the n-inner base 19; $N_A=5\times10^{18}$cm$^{-3}$ for the inner-p base 20 and $N_D=5\times10^{19}$ cm$^{-3}$ for the cathode electrode 22. The following layer dimensions were also effectively employed in the FIG. 3 preferred embodiment: outer P-anode layer 18 height 1 μm; inner n-base layer 19 height 2 μm; inner p-base layer 20 height 2 μm; outer N-cathode bottom layer 21 height of 3 μm, all heights being along a vertical axis. The anode width of 9.5 μm of ridge 44 along the horizontal axis is greater than the cathode electrode 22 width of 4 μm, with said p-base inner layer 20 and said outer N-cathode bottom layer 21 each having a width of 16 μm. It has been observed that better performance occurs if the dopant concentrations of the P-anode and N-cathode regions are not too much higher than the p-base and n-base regions. It is noted that the preferred embodiment used GaAs layers with the specified dopants and other parameters. However, other materials such as direct band gap semiconductor materials, quantum well structures and heterostructures may also be employed. When using quantum well structures for the layers, at least the inner n-base layer 19 and the inner p-base layer 20 should be composed of that material. When using heterostructure layers, the inner n-base layer 19 and inner p-base layer 20 will each have a narrower band gap than the outer P-anode layer 18 and outer N-cathode bottom layer 21. These layer materials, together with suitable dopants known to those skilled in the art may also be effectively and advantageously used in accordance with the present invention and are considered to be within the scope of this invention.

Referring now to the FIG. 4 graph, it demonstrates the current flow switching from one spatial location to another as the gate bias changes. Shown is the Z directed current density at 3 μm below the topmost P-anode region's surface. Similarly, the FIG. 5 chart shows the Z-directed current density at 4.5 μm below topmost P-anode region's surface. These charts indicate that narrow ON channels occur at the edges of the ridge, and also demonstrate that the narrow current channels are maintained over a good portion of the current's flow path.

Referring now to FIG. 6, this graph depicts light emission being spatially switched from the region below the right edge of the ridge, to the left edge of the device as the gate's reverse bias increases from 0.2403 V to 5.0 V. The figure shows the radiative recombination rate along a horizontal line 4.5 μm below the topmost P-anode's surface of the device. The light emission follows the current channel as indicated by this graph.

Figure 7:
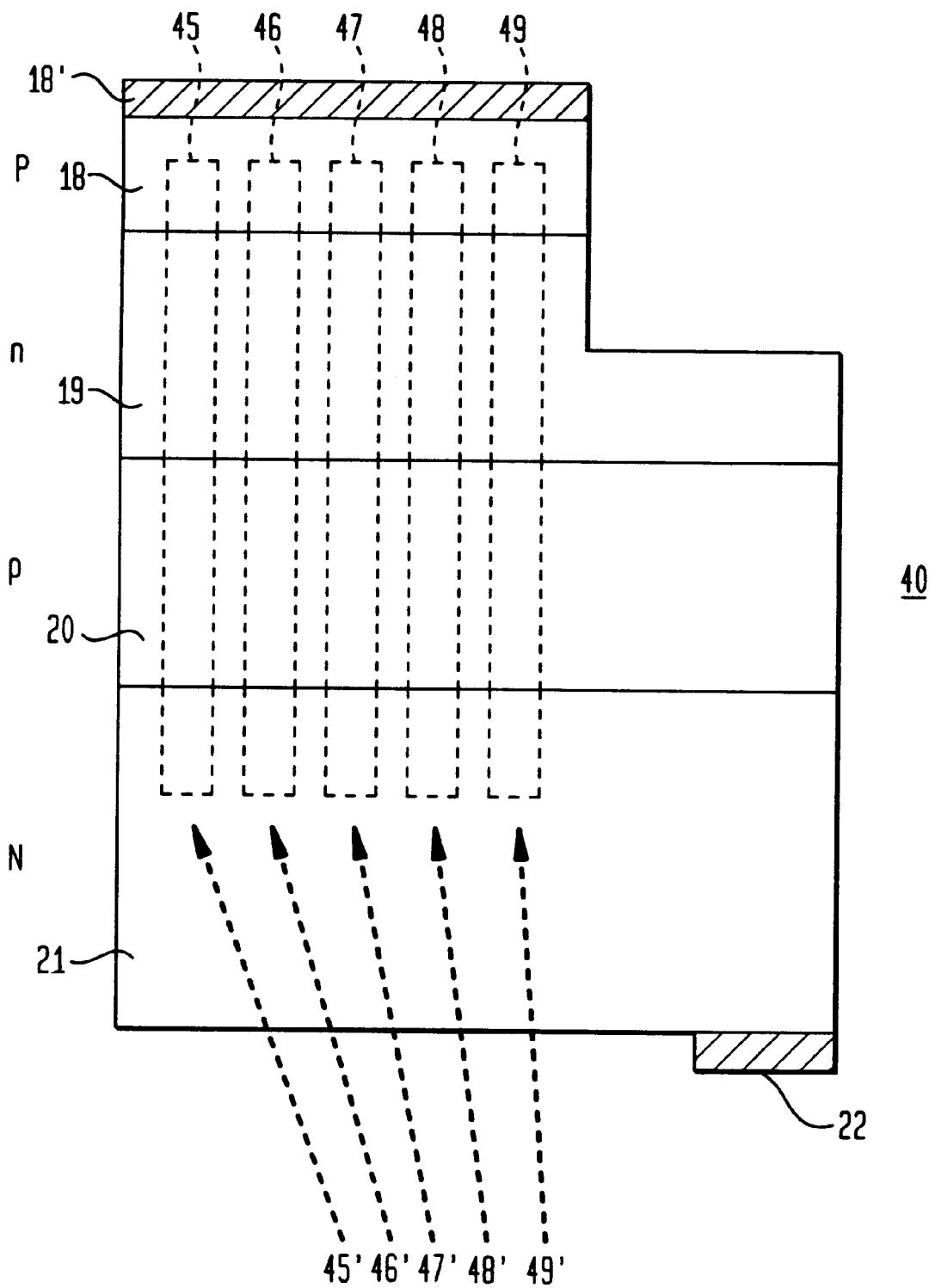
FIG. 7 is a conceptual, cross-sectional diagram of the present invention illustrating the phenomena that maintain a narrow ON state current channel when the device current is below the holding current.

Referring now to FIG. 7, which is a conceptual, cross-sectional diagram of a semiconductor 40 for spatially switching light of the present invention, employing like numerals for the same FIGS. 1 and 2 structural elements, illustrating how the narrow ON state current channel is maintained in the device when the device current is below the holding current. This drawing depicts a number of narrow channel vertical PnpN regions 45–49, respectively, within the device, with a number of current flows, indicated by arrows 45'–49', respectively. This drawing illustrates that when current flowing from anode electrode 18' to cathode electrode 22 is spread out to flow through more than one narrow channel vertical PnpN regions, the current 45'–49', respectively, flowing through each narrow channel region 45–49, respectively, will be below the ON state threshold and the entire device 40 will turn OFF.

Figure 8A:
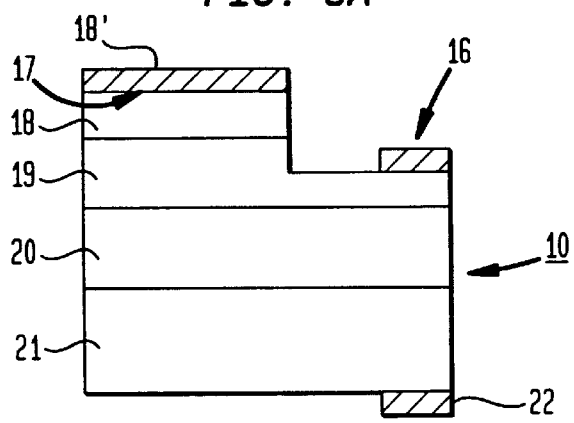
FIGS. 8(a)–(c) are conceptual, front view sketches of alternative embodiments of the semiconductor for spatially switching light device of the present invention illustrating possible variations in cathode placement.
Figure 8B:
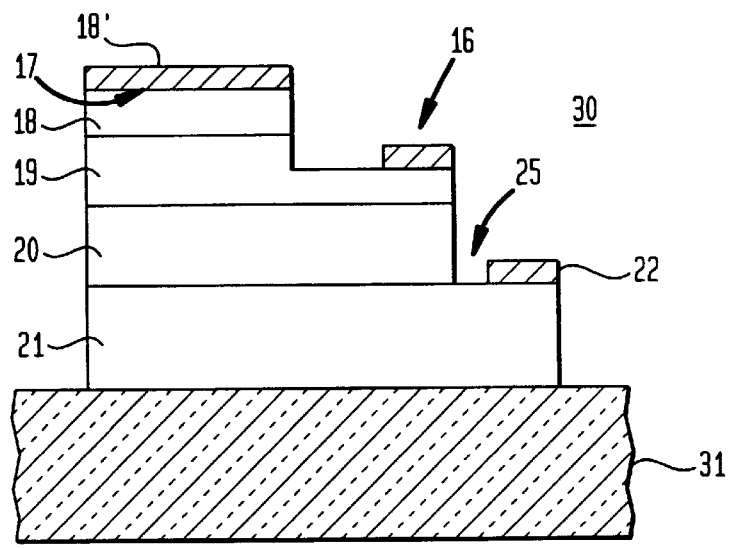
Figure 8C:
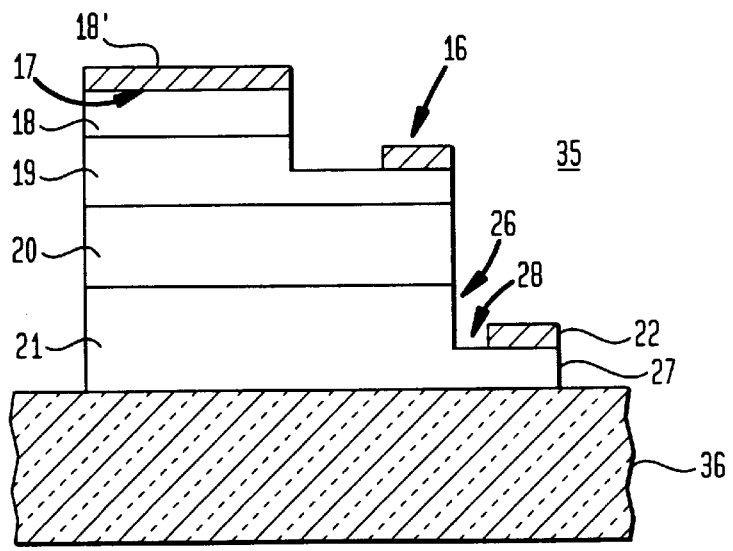

A number of potential variations of the semiconductor device for spatially switching light include fabricating the spatial light emitter device with several different cathode electrode placements that would induce the lateral current flow necessary for turn ON to occur first at the left or right edges of the ridge. Referring now to FIGS. 8 (a)–(c) there are depicted FIG. 8(a) for comparison purposes and in FIGS. 8(b) and 8(c) two conceptual, front view sketches of alternative embodiments of the semiconductor device for spatially switching light of the present invention illustrating possible variations in cathode placement, with like numerals being employed to designate the same structural elements. FIG. 8 (a) depicts a front view sketch of the semiconductor device 10 depicted more fully in FIGS. 1–3 embodiment of the present invention, with FIGS. 8(b) and (c) showing two possible variations with said outer N-cathode layer 21 extending outward on the gate electrode side. FIG. 8(a) depicts a front view sketch of the semiconductor device 10 depicted more fully in FIGS. 1–3 embodiment of the present invention, with FIGS. 8(b) and (c) showing two possible variations with said outer N-cathode bottom layer 21 extending outward on the gate electrode side. In FIG. 8(b), that embodiment of the semiconductor device for spatially switching light 30 comprises said outer N-cathode bottom layer 21 being wider than said inner p-base layer 20, said outer N-cathode bottom layer 21 having an exposed top surface 25 and the cathode electrode 22 being disposed on said exposed top surface 25. In this alternate embodiment, FIG. 8(b) shows device 30 disposed on a substrate 31 composed of glass, however, device 30 could also be disposed on any other type of suitable substrate. FIG. 8(c) shows an alternate embodiment of the semiconductor device for spatially switching light 35 comprising said outer N-cathode bottom layer 21 with an upper portion 26 having the same horizontal width as the inner p-base layer 20 and a lower portion 27 extending outward on the gate electrode side. Here, the lower portion 27 of the outer N-cathode bottom layer 21 is wider than the inner p-base layer 20, the lower portion 27 of the outer N-cathode bottom layer 21 has a top surface 28 and the cathode electrode 22 is disposed on the top surface 28 of the outer N-cathode bottom layer's lower portion 27. In this alternate embodiment, FIG. 8(c) depicts device 35 disposed on a substrate 36 composed of an oxide material, however it could also be disposed on any type of suitable substrate. Further, the doping of the anode or cathode layers could be modified to aid the lateral current flow in order to control the location of the device current channel.

Figure 9A:
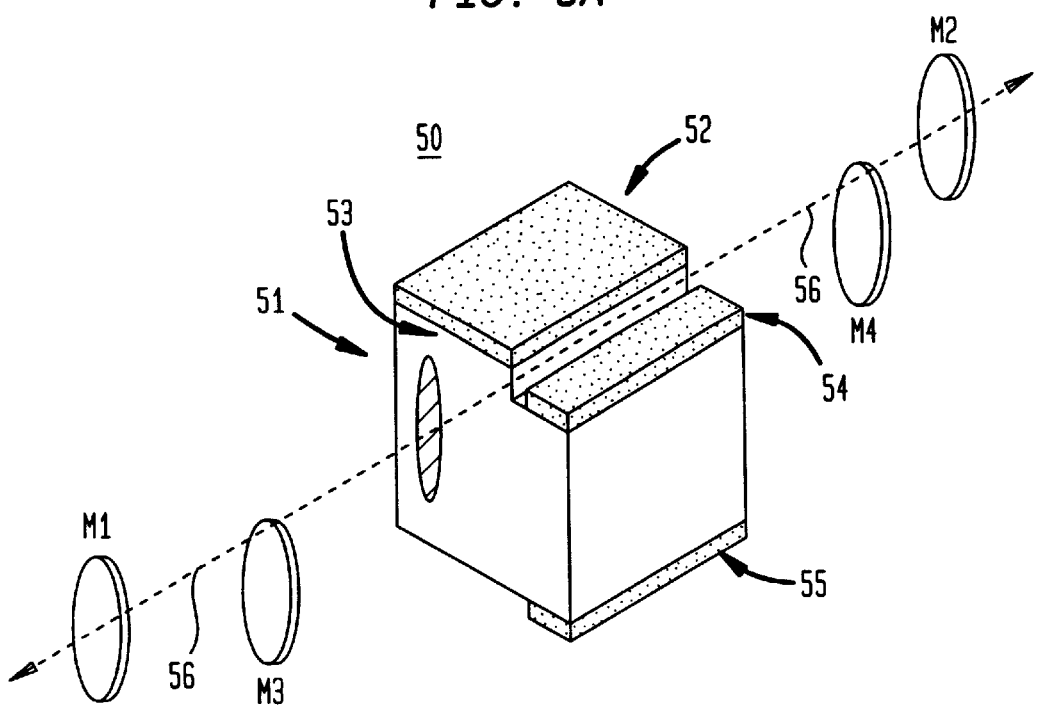
FIG. 9 is a conceptual, cross-sectional perspective drawing illustrating the operation of the laser embodiment of the semiconductor device for spatially switching light of the present invention.
Figure 9B:
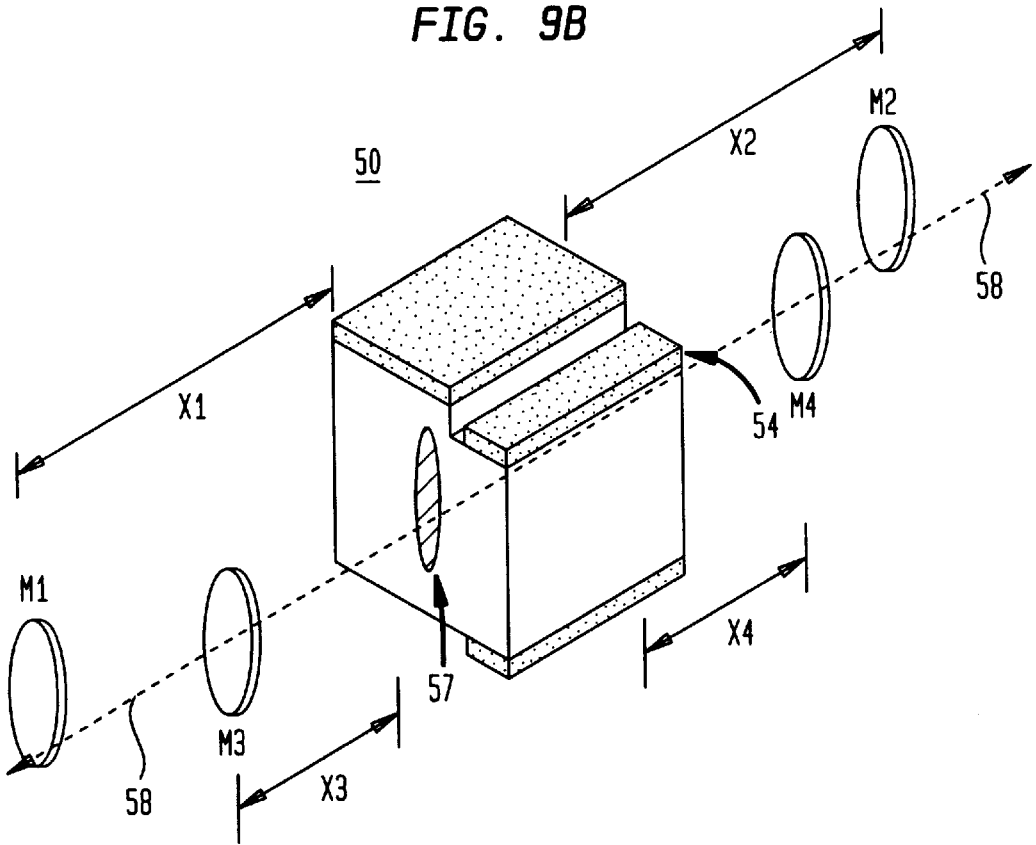

A number of other embodiments of semiconductor devices for spatially switching light are also within the contemplation of the present invention. For use as a laser, either the mirrors could be formed by cleaving the present invention's semiconductor thyristor based structure, or anti-reflection coatings could be applied to the semiconductor's surfaces, and an external cavity configuration could be used. FIGS. 9(a) and 9(b) are conceptual, cross-sectional perspective drawings depicting the operation of the laser embodiment of the semiconductor device for spatially switching light of the present invention. FIG. 9(a) illustrates operation with a high reverse bias while FIG. 9(b) illustrates operation of that same structure with a low reverse bias.

Referring now to FIG. 9(a), the semiconductor device for spatially switching light in a laser 50 similar to the structure depicted in FIGS. 1–3 of the present invention is depicted. However, in FIGS. 9(a) and (b) the P-Anode base, inner n-base, inner p-base and outer N-cathode bottom layers have been omitted from the drawing for the sake of simplicity. The semiconductor device 50 for spatially switching light of a laser of the present invention comprises a current flow to induce a transversely flowing, narrow, light emitting channel that can be spatially shifted by switching a single electrode's bias, with a plurality of mirrors for laser operations. The crosshatched elliptical region 51 emits light, and an anode electrode 52 is disposed on the structure's top surface, the top surface defining a ridge 53, said ridge 53 having an anode width, W. A gate electrode 54 employs a means for biasing to provide a high reverse bias in FIG. 9(a). A cathode electrode 55, having a width, W', lesser than the anode width, W, is disposed on the bottom surface of structure 50. As in the FIGS. 1–3 embodiment when high reverse bias is employed, said light emission region 51 opposes said gate electrode 54. The FIG. 9(b) semiconductor device 50 for spatially switching light of a laser is the same as in FIG. 9(a), except that a light emission region 57 is indicated in more proximity to said gate electrode 54 because in FIG. 9(b) low reverse bias is employed.

In both FIGS. 9(a) and (b), M1–M4 are a plurality of mirrors whose distances to the face of the device 50 are indicated by arrows X1–X4 of FIG. 9(b). The laser embodiment of the present invention provides the gain medium of the semiconductor laser with an external cavity. The dashed line 56 cutting through said mirrors M1 and M2 in FIG. 9(a) and dashed line 58 cutting through said mirrors M3 and M4 in FIG. 9(b) are the respective light emission axes.

Depending on the bias on the gate electrode 54, the laser formed by said mirrors M1 and M2 with device 50 in FIG. 9(b), or by said mirrors M3 and M4 with device 50 will then be in operation. If said distances X1 and X2 are not equal to said distances X3 and X4, the FIG. 9(a) high reverse bias laser device 50 will emit at different modes and thus different frequencies compared to those achieved by the FIG. 9(b) low reverse bias laser device 50.

Several variations of the FIGS. 9(a) and (b) laser embodiment of the present invention are possible, including different internal or external cavity lengths for the two light emission regions, 51 and 57, respectively, to produce different round trip times. Producing different round trip times in accordance with the present invention would lead to a change in a pulsed laser's repetition rate as the light is spatially switched using the gate bias. Additionally, the variations in materials used, structures employed and other details of the FIGS. 1–3 and 8 semiconductor device for spatially switching light embodiment apply equally here as well. Further, this semiconductor 50 for spatially switching light of a laser could also be used either in an edge emitting laser structure or a vertical cavity laser structure. One can shield part of device 50 to rapidly shift said first and second light emission regions to the shielded portion in order to avoid detection, or attain improved gain by placing lower refractive index materials around the regions. The device 50 can also operate as a beam steering light emitter to emit light in a laser cavity of other mirrors. Also, the biasing means can alter the low or high reverse bias to rapidly shift the light emission regions and also shut down the laser. Also, one can provide a low resistance dopant concentration for the inner n-base and inner p-base layers which is close to a second low resistance dopant concentration of the outer P-anode and N-cathode layers.

Additionally, the semiconductor for spatially switching light of a laser of the present invention could also serve as the active region of a laser, or an incoherent light emitter. A laser based on this device could have either an internal or an external cavity structure, and an edge emitting or vertical cavity emitting structure. The device could be made from a single semiconducting material, or use several different semiconductor materials with numerous other band gap configurations to improve the current injection to the active region, and the charge carrier confinement for stronger light emission.

Figure 10A:
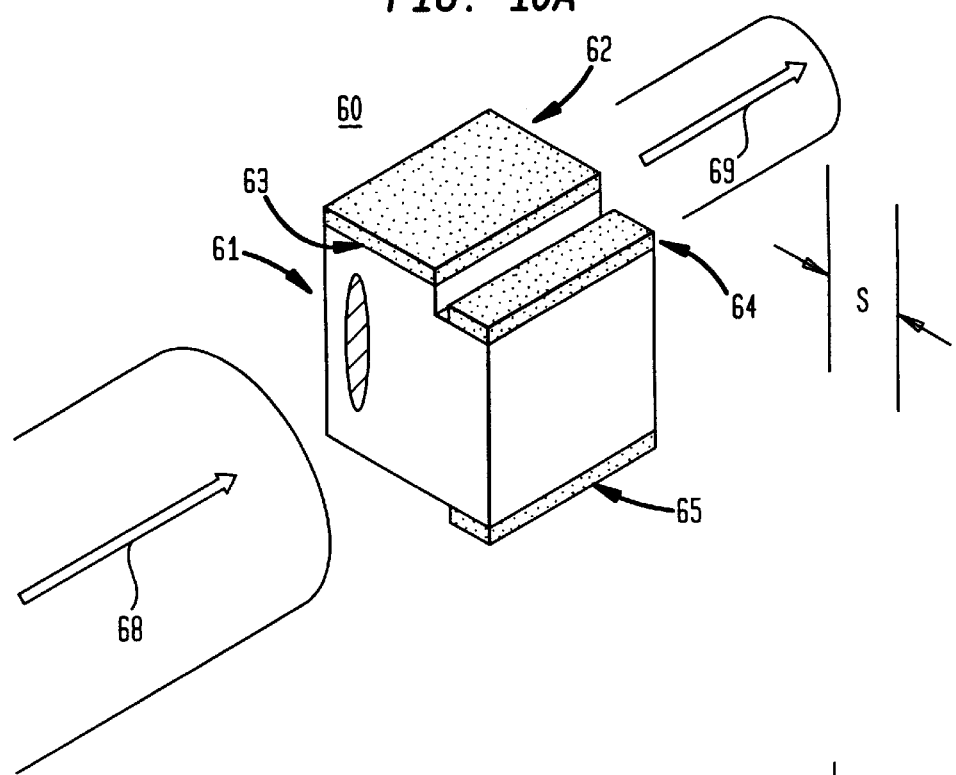
FIG. 10 is a conceptual, cross-sectional perspective drawing illustrating the operation of the laser embodiment of the semiconductor for spatially switching light of the present invention.
Figure 10B:
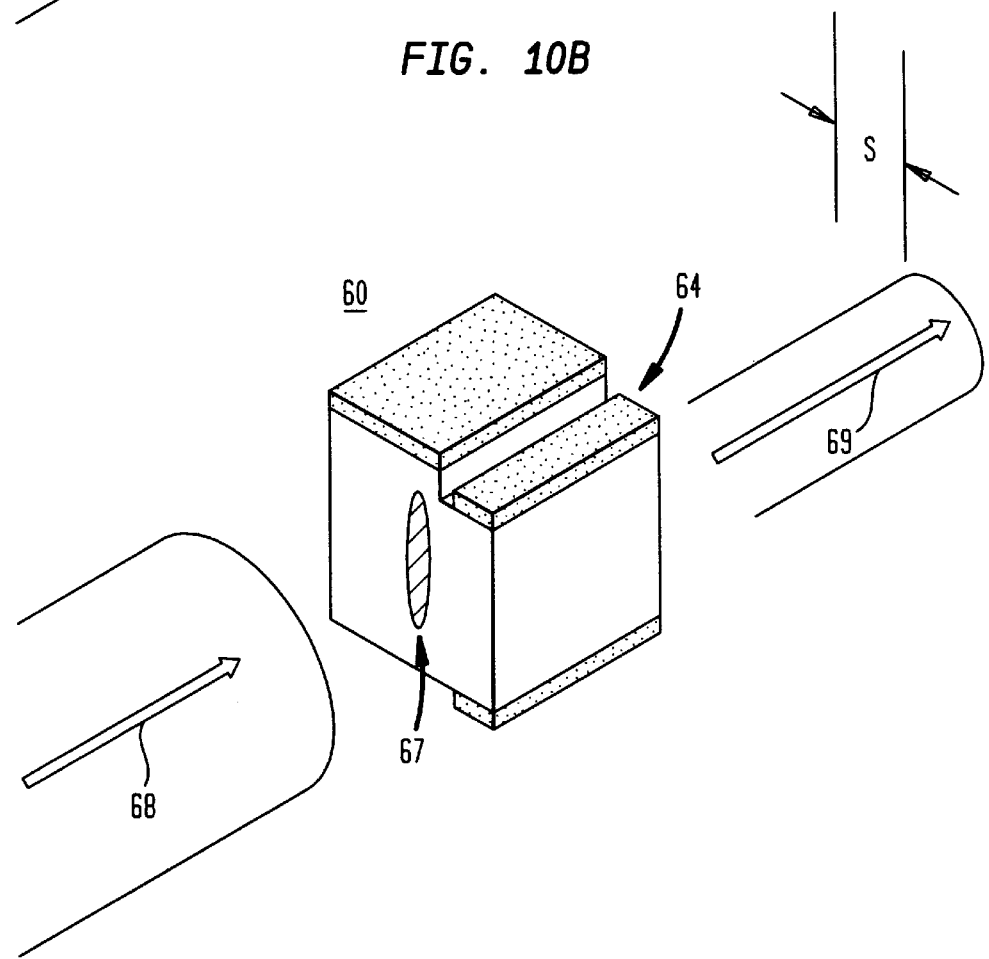

It is also within the contemplation of the present invention to provide a semiconductor device for spatially switching light of a selective amplifier. In this selective amplifier embodiment, two light beams would be focused on the bases of this structure, one at each location to which the current channel could be spatially switched. The beam which is incident on the region of high charge carrier concentration density, which is the location of the current channel, would see amplification, and the beam which is incident on the region of low concentration density would be absorbed. FIG. 10 is a conceptual, cross-sectional perspective drawing illustrating the operation of the selective amplifier embodiment of the semiconductor 60 for spatially switching light of the present invention. FIG. 10(a) illustrates operation with a high reverse bias while FIG. 10(b) illustrates operation of that same structure with a low reverse bias.

Referring now to FIG. 10(a), the semiconductor 60 for spatially switching light of a selective amplifier similar to the structure depicted in FIGS. 1–3 of the present invention is depicted. However, the outer P-Anode, inner n-base, inner p-base and outer N-cathode bottom layers, current flow and narrow PnpN channel of FIGS. 1–3 have been omitted from these drawings for the sake of simplicity. The semiconductor device 60 for spatially switching light of a selective amplifier comprises a current flow to induce a transversely flowing, narrow, light emitting channel that can be spatially shifted by switching a single electrode's bias, providing a spatially smaller diameter light beam after light is injected through the light emission region. The crosshatched elliptical region 61 emits light, and an anode electrode 62 is disposed on the structure's top surface, the top surface defining a ridge 63, said ridge 63 having a ridge width, W. A gate electrode 64 employs a means for biasing to provide a high reverse bias in FIG. 10(a). A cathode electrode 65, having a width, W', lesser than said ridge width, W, is disposed on the bottom surface of structure 60. As in the FIGS. 1–3 embodiment when high reverse bias is employed, said light emission region 61 opposes said gate electrode 64. The FIG. 10(b) semiconductor device 60 for spatially switching light of a selective amplifier is the same as in FIG. 10(a) except that a light emission region 67 is indicated in more proximity to said gate electrode 64 because in FIG. 10(b) low reverse bias is employed.

In FIG. 10(a), a large beam of light, indicated by arrow 68 from a light source is injected into said light emission region 61 of the semiconductor 60 for spatially switching light of a selective amplifier, a spatially smaller diameter light beam, indicated by arrow 69, is produced. The intensity of said smaller diameter light beam 69 is related to the energy in the beam, and could be smaller or larger depending on how much current is injected, and flows through, from said anode 62 to cathode 65. In FIG. 10(b), a large beam of light, indicated by arrow 68 is injected into said light emission region 67 of the semiconductor device 60 for spatially switching light of a selective amplifier, a spatially smaller diameter light beam, indicated by arrow 69, is produced. S is the amount that the output light has been spatially shifted. S is the amount that the output light has been spatially shifted. The physics explaining the amplification process is given in the next paragraph.

Amplification of light is due to a population inversion in the gain medium, or amplifier, that leads to a state that has gain. In semiconductor devices the population consists of electrons and holes, and inversion is a non-equilibrium state where there are more electrons and holes than that which occurs in equilibrium. Inversion is caused by a very strong current that brings more electrons and holes in a specific location, and device properties that confine the electrons and holes to that location long enough so that more of them recombine and emit photons. Regions that do not have gain will instead exhibit loss whereby the incident light will be absorbed by the material.

Figure 11:
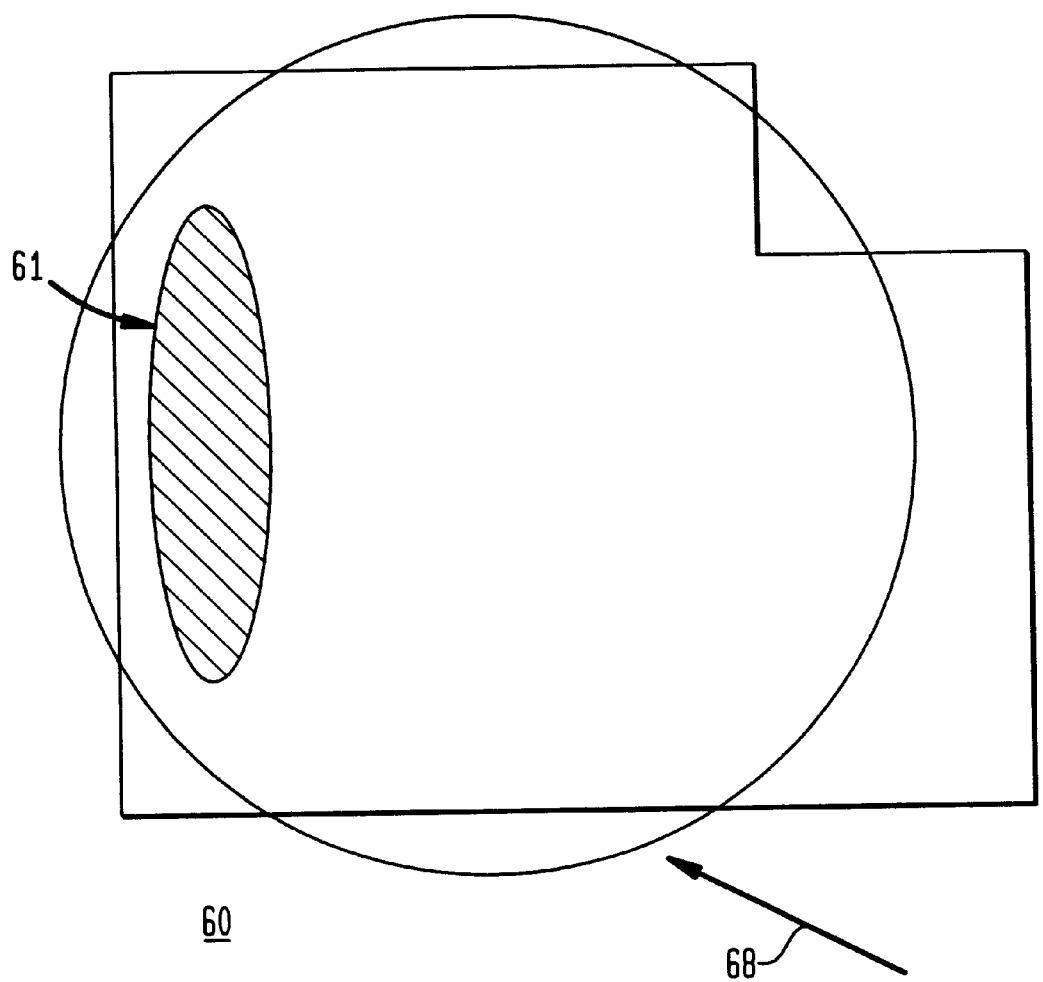
FIG. 11 is a conceptual, front view drawing illustrating the operation of the laser embodiment semiconductor for spatially switching light of the present invention and light absorption.

In both FIGS. 10(a) and (b), the crosshatched light emission regions 61 and 67, respectively, is the region that exhibits gain. It is also the region that the current flow is confined to as discussed in FIGS. 9(a) and (b). Therefore, the half, of the beam, incident on the light emission regions 61 and 67, respectively, in FIGS. 10(a) and (b) will be amplified and the half of the beam, incident on the remaining portion of the structure will be absorbed. In the semiconductor device 60 for spatially switching light of a selective amplifier, it is necessary that the wavelength of the injected light beam 68 exhibits energy that is greater than the forbidden energy gap of the semiconductor. The light's energy is calculated from the formula E=hv, where E is the energy, h is Planck's constant, and $\upsilon$ is the frequency. FIG. 11 is a conceptual, front view drawing illustrating more clearly the fraction of the beam that is absorbed and the fraction of the beam that is amplified using a front end view of the selective amplifier 60, which is the view that the incident beam sees.

Additionally, the variations in materials used, structures employed and other details of the FIGS. 1–3 and 8A–C semiconductor for spatially shifting light embodiment apply equally here as well. One variation is to provide a low resistance dopant concentration for the inner n-base and inner p-base layers which is close to a second low resistance dopant concentration of the outer P-anode and N-cathode layers. Further, said biasing means can alter either the low or high reverse bias to rapidly shift said first and second light emission regions.

It should be understood, of course, the foregoing disclosure relates only to a small number of preferred embodiments and that numerous modifications and alterations may be made herein without departing from the spirit and scope of the invention as set forth in the appended claims.

What we claim is:

1. A semiconductor device for spatially switching light in an optical switching network, comprising:

an anode electrode deposited on an outer P-anode layer having an ohmic contact surface, said outer P-anode layer being stacked on an upper portion of an inner n-base layer;

said inner n-base layer being stacked on an inner p-base layer, said inner p-base layer having a horizontal width and being stacked on an outer N-cathode bottom layer having a bottom surface and said horizontal width;

said inner n-base layer having said upper portion and a lower portion, said lower portion extending outward on one side of said inner n-base layer along a horizontal axis, said lower portion having said horizontal width, said upper and lower portions defining a ledge;

said outer P-anode layer, said inner n-base layer, said inner p-base layer and said outer N-cathode bottom layer being composed of a direct band gap semiconductor material;

said outer P-anode layer having an anode width, W;

a gate electrode disposed on said ledge, said gate electrode forming an ohmic junction where said ledge is contacted, said gate electrode having a gate contact and defining a gate electrode side, said gate electrode being connected to a means for biasing;

said anode electrode being forward biased with respect to a cathode electrode deposited on said gate electrode side of the bottom surface;

said outer P-anode layer and said outer N-cathode bottom layer being more highly doped than said inner n-base layer and said inner p-base layer;

said cathode electrode having an ohmic contact surface and a cathode electrode width, W', less than said anode width, W, thereby exposing that portion of said bottom surface of the outer N-cathode bottom layer lying directly below said anode;

a current path flows vertically from said anode electrode to said outer N-cathode bottom layer;

said cathode electrode inducing a lateral current flow horizontally through said outer N-cathode bottom layer, forming a transversely flowing narrow PnpN channel;

said biasing means providing a low reverse bias from said gate electrode causing said PnpN channel to spatially shift toward said gate electrode side and emit light to said optical switching network from a first light emission region on said gate electrode side; and said biasing means providing a high reverse bias from said gate electrode causing said PnpN channel to spatially shift away from said gate electrode side and emit light to said optical switching network from a second light emission region opposite from said gate electrode side.

2. The semiconductor device for spatially switching light in an optical switching network, as recited in claim 1, wherein said direct band gap semiconductor material is a binary compound.

3. The semiconductor device for spatially switching light in an optical switching network, as recited in claim 1, wherein said direct band gap semiconductor material is a ternary compound.

4. The semiconductor device for spatially switching light in an optical switching network, as recited in claim 1, wherein said direct band gap semiconductor material is a quaternary compound.

5. The semiconductor device for spatially switching light in an optical switching network, as recited in claim 1, further comprising forming a ridge on said anode electrode by etching.

6. The semiconductor device for spatially switching light in an optical switching network, as recited in claim 1, wherein said direct band gap semiconductor material is GaAs.

7. The semiconductor device for spatially switching light in an optical switching network, as recited in claim 6, further comprising:

said outer P-anode layer being doped with beryllium dopant atoms;

said n-inner base layer being doped with silicon dopant atoms;

said inner-p base layer being doped with beryllium dopant atoms; and said outer N-cathode bottom layer being doped with silicon dopant atoms.

8. The semiconductor device for spatially switching light in an optical switching network, as recited in claim 7, further comprising an abrupt junction between each of said layers.

9. The semiconductor device for spatially switching light in an optical switching network, as recited in claim 5, further comprising said ridge being widened to provide increased spatial separation between said first and second light emission regions.

10. The semiconductor device for spatially switching light in an optical switching network, as recited in claim 8, further comprising said bottom surface of the outer N-cathode bottom layer being constructed so that said semiconductor device can be grown on a substrate.

11. The semiconductor device for spatially switching light in an optical switching network, as recited in claim 10, further comprising said bottom surface of outer N-cathode bottom layer being constructed so that said semiconductor device can be fabricated on said substrate.

12. The semiconductor device for spatially switching light in an optical switching network, as recited in claim 11, further comprising said substrate being glass.

13. The semiconductor device for spatially switching light in an optical switching network, as recited in claim 11, further comprising said substrate being an oxide material.

14. The semiconductor device for spatially switching light in an optical switching network, as recited in claim 7, further comprising:
said inner n-base layer and said inner p-base layer each having a first low resistance dopant concentration; and
said first low resistance dopant concentration being in the vicinity of a second low resistance dopant concentration of said outer P-anode layer and outer N-cathode bottom layer.

15. The semiconductor device for spatially switching Light in an optical switching network, as recited in claim 14, further comprising:
said outer P-anode layer having a dopant concentration of $N_A = 5 \times 10^{19}$ cm$^{-3}$;
said n-inner base layer having a dopant concentration of $N_D = 5 \times 10^{18}$ cm$^{-3}$;
said inner-p base layer having a dopant concentration of $N_A = 5 \times 10^{18}$ cm$^{-3}$; and
said outer N-cathode bottom layer having a dopant concentration of $N_D = 5 \times 10^{19}$ cm$^{-3}$.

16. The semiconductor device for spatially switching light in an optical switching network, as recited in claim 15, further comprising:
said anode width being 9.5 μm along said horizontal axis;
said outer P-anode layer having a height of 1 μm along said vertical axis;
said inner n-base layer having a height of 2 μm opposite from said gate electrode side;
said inner n-base layer having an upper horizontal width of 9.5 μm and a lower horizontal width of 16 μm;
said inner p-base layer having a height of 2 μm;
said outer N-cathode bottom layer having a height of 3 μm;
said cathode electrode width being 4 μm along said horizontal axis;
said p-base inner layer having a width of 16 μm; and
said outer N-cathode bottom layer having a width of 16 μm.

17. The semiconductor device for spatially switching light in an optical switching network, as recited in claim 1, wherein said inner n-base layer contains a quantum well structure.

18. The semiconductor device for spatially switching light in an optical switching network, as recited in claim 1, wherein said inner p-base layer contains a quantum well structure.

19. The semiconductor device for spatially switching light in an optical switching network, as recited in claim 1, wherein at least said inner n-base layer and said inner p-base layer are composed of quantum well structures.

20. The semiconductor device for spatially switching light in an optical switching network, as recited in claim 1, further comprising:
said layers being composed of heterostructures; and
said inner n-base layer and said inner p-base layer each having a narrower band gap than said outer P-anode layer and said outer N-cathode bottom layer.

21. The semiconductor device for spatially switching light in an optical switching network, as recited in claim 1, wherein said outer N-cathode bottom layer extends outward along said horizontal axis on said gate electrode side.

22. The semiconductor device for spatially switching light in an optical switching network, as recited in claim 21, further comprising:
said outer N-cathode bottom layer being wider than said horizontal width of the inner p-base layer;
said outer N-cathode bottom layer having an exposed top surface; and
said cathode electrode being disposed on said exposed top surface.

23. The semiconductor device for spatially switching light in an optical switching network, as recited in claim 21, wherein:
said outer N-cathode bottom layer has an upper portion having said horizontal width and a lower portion that extends further outward on said gate electrode side;
said lower portion of the outer N-cathode bottom layer being wider than said horizontal width of the inner p-base layer;
said lower portion of the outer N-cathode bottom layer having a top surface; and
said cathode electrode is deposited on said top surface of the lower portion of the outer N-cathode bottom layer.

24. The semiconductor device for spatially switching light in an optical switching network, as recited in claim 1, wherein:
said anode electrode and said cathode electrode each provide a fixed voltage; and
said low reverse bias from the biasing means connected to said gate electrode is varied in order to switch said current path.

25. The semiconductor device for spatially switching light in an optical switching network, as recited in claim 1, further comprising:
said inner n-base layer and said inner p-base layer being constructed of a direct gap semiconductor material having a given energy gap; and
said outer P-anode layer and said outer N-cathode bottom layer having a second energy gap greater than said given energy gap.

26. The semiconductor device for spatially switching light in an optical switching network, as recited in claim 1, further comprising:
said biasing means providing a low reverse bias from said gate electrode causing said PnpN channel to spatially shift toward said gate electrode side and form a first light emission region on said gate electrode side;
said first light emission region receiving a first beam of light from a first set of mirrors disposed in proximity to said first light emission region along a first light emission axis extending from a first one of said first set of mirrors through said first light emission region and toward a second one of said, first set of mirrors disposed behind said first light emission region providing a first beam of laser light;

said biasing means providing a high reverse bias from said gate electrode causing said PnpN channel to spatially shift away from said gate electrode side and form a second light emission region opposite from said gate electrode side; and said second light emission region receiving a second beam of light from a second set of mirrors disposed in proximity to said second light emission region along a second light emission axis extending from a first one of said second set of mirrors through said second light emission region and toward a second one of said second set of mirrors disposed behind said second light emission region providing a second beam of laser light.

27. The semiconductor device for spatially switching light in an optical switching network, as recited in claim 26, wherein said semiconductor device functions as a laser.

28. The semiconductor device for spatially switching light in an optical switching network, as recited in claim 27, further comprising rapidly spatially shifting said first and second light emission regions to a shielded portion of said semiconductor device in order to avoid detection.

29. The semiconductor device for spatially switching light in an optical switching network, as recited in claim 27, further comprising:

operating said semiconductor device as a beam steering light emitter;

spatially shifting said first and second light emission regions to emit said light in a laser cavity formed by a plurality of mirrors; and providing a plurality of varied wavelength and emission mode characteristics.

30. The semiconductor device for spatially switching light in an optical switching network, as recited in claim 27, wherein said biasing means alters said high reverse bias to rapidly spatially shift said first and second light emission regions.

31. The semiconductor device for spatially switching light in an optical switching network, as recited in claim 27, wherein said biasing means alters said low reverse bias to rapidly spatially shift said first and second light emission regions.

32. The semiconductor device for spatially switching light in an optical switching network, as recited in claim 27, wherein said biasing means alters said low reverse bias to rapidly shut down said laser.

33. The semiconductor device for spatially switching light in an optical switching network, as recited in claim 27, wherein said biasing means alters said high reverse bias to rapidly shut down said laser.

34. The semiconductor device for spatially switching light in an optical switching network, as recited in claim 27, further comprising:

positioning said first set of mirrors from said first light emission region at a different distance than said second set of mirrors are positioned from said second light emission region; and said second light emission region providing a plurality of light emissions at a different frequency than said first light emission region.

35. The semiconductor device for spatially switching light in a laser for an optical switching network, as recited in claim 26, further comprising:

surrounding said first and second light emission regions with lower refractive index materials; and providing photon confinement resulting in improved gain.

36. A semiconductor device for spatially switching light in a selective amplifier for an optical switching network, comprising:

an anode electrode deposited on an outer P-anode layer having an ohmic contact surface, said outer P-anode layer being stacked on an upper portion of an inner n-base layer;

said inner n-base layer being stacked on an inner p-base layer, said inner p-base layer having said horizontal width and being stacked on an outer N-cathode bottom layer having a bottom surface and said horizontal width;

said inner n-base layer having said upper portion and a lower portion, said lower portion extending outward on one side of said inner n-base layer along a horizontal axis, said lower portion having said horizontal width, said upper and lower portions defining a ledge;

said outer P-anode layer, said inner n-base layer, said inner p-base layer and said outer N-cathode bottom layer being composed of a direct band gap semiconductor material;

said outer P-anode layer having an anode width, W;

a gate electrode disposed on said ledge, said gate electrode having an ohmic contact surface, said gate electrode defining a gate electrode side, said gate electrode being connected to a means for biasing;

said anode electrode being forward biased with respect to a cathode electrode deposited on said gate electrode side of the bottom surface;

said outer P-anode layer and said outer N-cathode bottom layer being more highly doped than said inner n-base layer and said inner p-base layer;

said cathode electrode having an ohmic contact surface and a cathode electrode width, W', said cathode electrode width, W', being less than said anode width, W, thereby exposing that portion of said bottom surface of the outer N-cathode bottom layer lying directly below said anode;

a current path flows vertically from said anode electrode to said outer N-cathode bottom layer;

said cathode electrode inducing a lateral current flow horizontally through said outer N-cathode bottom layer, forming a transversely flowing narrow PnpN channel;

said biasing means providing a low reverse bias from said gate electrode causing said PnpN channel to spatially shift toward said gate electrode side and form a first light emission region on said gate electrode side;

said first light emission region receiving a beam of injected light from a light source of the optical switching network, said beam of injected light having a given intensity, said light source being disposed in proximity to said first light emission region, said beam of injected light passing through said first light emission region, said first light emission region producing a first spatially smaller diameter beam behind said first light emission region, said first spatially smaller diameter beam having a greater intensity than said given intensity of the beam of injected light;

said biasing means providing a high reverse bias from said gate electrode causing said PnpN channel to spatially shift away from said gate electrode side and form a second light emission region opposite from said gate electrode side; and said second light emission region receiving said beam of injected light from said light source, said beam of injected light having a predetermined intensity, said light source being disposed in proximity to said second light emission region, said beam of injected light passing through said second light emission region, said second light emission region producing a second spatially smaller diameter beam behind said second light emission region, said second spatially smaller diameter beam having a greater intensity than said predetermined intensity of the beam of injected light.

37. The semiconductor device for spatially switching light in a selective amplifier for an optical switching network, as recited in claim 36, wherein said direct band gap semiconductor material is a binary compound.

38. The semiconductor device for spatially switching light in a selective amplifier of an optical switching network, as recited in claim 36, wherein said direct band gap semiconductor material is a ternary compound.

39. The semiconductor device for spatially switching light in a selective amplifier of an optical switching network, as recited in claim 36, wherein said direct band gap semiconductor material is a quaternary compound.

40. The semiconductor device for spatially switching light in a selective amplifier of an optical switching network, as recited in claim 36, further comprising forming a ridge on said anode electrode by etching.

41. The semiconductor device for spatially switching light in a selective amplifier of an optical switching network, as recited in claim 36, wherein said direct band gap semiconductor material is GaAs.

42. The semiconductor device for spatially switching light in a selective amplifier of an optical switching network, as recited in claim 41, further comprising an abrupt junction between each of said layers.

43. The semiconductor device for spatially switching light in a selective amplifier of an optical switching network, as recited in claim 40, further comprising said ridge being widened to provide increased spatial separation between said first and second light emission regions.

44. The semiconductor device for spatially switching light in a selective amplifier of an optical switching network, as recited in claim 42, further comprising said bottom surface of the outer N-cathode bottom layer being constructed so that said semiconductor device can be grown on a substrate.

45. The semiconductor device for spatially switching light in a selective amplifier of an optical switching network, as recited in claim 44, further comprising said bottom surface of the outer N-cathode bottom layer being constructed so that said semiconductor device can be fabricated on said substrate.

46. The semiconductor device for spatially switching light in a selective amplifier of an optical switching network, as recited in claim 45, further comprising said substrate being glass.

47. The semiconductor device for spatially switching light in a selective amplifier of an optical switching network, as recited in claim 45, further comprising said substrate being an oxide material.

48. The semiconductor device for spatially switching light in a selective amplifier of an optical switching network, as recited in claim 36, further comprising:

said inner n-base layer and said inner p-base layer each having a first low resistance dopant concentration; and said first low resistance dopant concentration being in the vicinity of a second low resistance dopant concentration of said outer P-anode layer and said outer N-cathode bottom layer.

49. The semiconductor device for spatially switching light in a selective amplifier of an optical switching network, as recited in claim 36, wherein said inner n-base layer contains a quantum well structure.

50. The semiconductor device for spatially switching light in a selective amplifier of an optical switching network, as recited in claim 36, wherein said inner p-base layer contains a quantum well structure.

51. The semiconductor device for spatially switching light in a selective amplifier of an optical switching network, as recited in claim 36, wherein at least said inner n-base layer and said inner p-base layer are composed of quantum well structures.

52. The semiconductor device for spatially switching light in a selective amplifier of an optical switching network, as recited in claim 36, further comprising:

said layers being composed of heterostructures; and said inner n-base layer and said inner p-base layer each having a narrower band gap than said outer P-anode layer and said outer N-cathode bottom layer.

53. The semiconductor device for spatially switching light in a selective amplifier of an optical switching network, as recited in claim 36, wherein said biasing means alters said high reverse bias to rapidly spatially shift said first and second light emission regions.

54. The semiconductor device for spatially switching light in a selective amplifier of an optical switching network, as recited in claim 36, wherein said biasing means alters said low reverse bias to rapidly spatially shift said first and second light emission regions.

55. The semiconductor device for spatially switching light in a selective amplifier of an optical switching network, as recited in claim 36, further comprising:

said inner n-base layer and said inner p-base layer being constructed of a direct gap semiconductor material having a given energy gap; and said outer P-anode layer and said outer N-cathode bottom layer having a second energy gap greater than said given energy gap.

56. The semiconductor device for spatially switching light in a selective amplifier for an optical switching network, as recited in claim 36, further comprising said first spatially smaller diameter beam having a lesser intensity than said given intensity of the first beam of injected light.

57. The semiconductor device for spatially switching light in a selective amplifier for an optical switching network, as recited in claim 36, further comprising said second spatially smaller diameter beam having a lesser intensity than said predetermined intensity of the beam of injected light.

58. The semiconductor device for spatially switching light in a selective amplifier for an optical switching network, as recited in claim 36, wherein said outer N-cathode bottom layer extends outward along said horizontal axis on said gate electrode side.

59. The semiconductor device for spatially switching light in a selective amplifier for an optical switching network, as recited in claim 58, further comprising:

said outer N-cathode bottom layer being wider than said horizontal width of the inner p-base layer;

said outer N-cathode bottom layer having an exposed top surface; and said cathode electrode being deposited on said exposed top surface.

60. The semiconductor device for spatially switching light in a selective amplifier for an optical switching network, as recited in claim 58, wherein:

said outer N-cathode bottom layer has an upper portion having said horizontal width and a lower portion that extends further outward on said gate electrode side;

said lower portion of the outer N-cathode bottom layer being wider than said horizontal width of the inner p-base layer;

said lower portion of the outer N-cathode bottom layer having a top surface; and said cathode electrode is deposited on said top surface of the lower portion of the outer N-cathode bottom layer.

61. The semiconductor device for spatially switching light in a selective amplifier for an optical switching network, as recited in claim 36, wherein:

said anode electrode and said cathode electrode each provide a fixed voltage; and said low reverse bias from the biasing means connected to said gate electrode is varied in order to switch said narrow current flow channel.

* * * * *